(12) United States Patent
Feichtinger et al.

(10) Patent No.: US 11,417,583 B2
(45) Date of Patent: Aug. 16, 2022

(54) LED MODULE

(71) Applicant: TDK Electronics AG, Munich (DE)

(72) Inventors: Thomas Feichtinger, Graz (AT); Franz Rinner, Frauental (AT); Werner Rollett, St Martin im Sulmtal (AT)

(73) Assignee: TDK ELECTRONICS AG, Munich (DE)

( * ) Notice: Subject to any disclaimer, the term of this patent is extended or adjusted under 35 U.S.C. 154(b) by 325 days.

(21) Appl. No.: 16/636,881

(22) PCT Filed: Aug. 10, 2018

(86) PCT No.: PCT/EP2018/071787
§ 371 (c)(1),
(2) Date: Feb. 5, 2020

(87) PCT Pub. No.: WO2019/034562
PCT Pub. Date: Feb. 21, 2019

(65) Prior Publication Data
US 2020/0294981 A1    Sep. 17, 2020

(30) Foreign Application Priority Data
Aug. 14, 2017   (DE) .......................... 102017118490.2

(51) Int. Cl.
*H01L 23/373*    (2006.01)
*H01L 23/34*    (2006.01)
(Continued)

(52) U.S. Cl.
CPC .......... *H01L 23/3731* (2013.01); *H01L 23/15* (2013.01); *H01L 23/34* (2013.01);
(Continued)

(58) Field of Classification Search
CPC ....... H01L 23/34; H01L 33/642; H01L 23/12; H01L 23/13; H01L 23/14; H01L 23/15; H01L 23/28; H01L 23/31; H01L 23/373; H01L 23/3731; H01L 23/3735; H01L 23/4037; H01L 23/4062; H01L 23/481; H01L 23/488; H01L 23/49822; H01L 23/49827; H01L 23/49833; H01L 23/49855; H05K 1/0206; H05K 1/0207; H05K 1/0306; H05K 1/189; H05K 2201/10106; H05K 2201/10151
See application file for complete search history.

(56) References Cited

U.S. PATENT DOCUMENTS 7,135,955 B2    11/2006    Feichtinger et al.
9,449,958 B2    9/2016    Feichtinger et al.
(Continued)

FOREIGN PATENT DOCUMENTS

DE    102012104494 A1    11/2013
DE    102014112673 A1    3/2016
(Continued)

*Primary Examiner* — Eduardo A Rodela
(74) *Attorney, Agent, or Firm* — Slater Matsil, LLP

(57) ABSTRACT

An LED module is disclosed. In an embodiment an LED module includes a thermally conductive substrate made of a multilayer ceramic, at least one LED on the substrate, passive SMD components arranged on the substrate, a passive component integrated in the substrate and a heat spreader configured to dissipate waste heat in horizontal and vertical directions.

17 Claims, 2 Drawing Sheets

(51) Int. Cl.
  *H01L 23/60* (2006.01)
  *H01L 25/075* (2006.01)
  *H01L 25/16* (2006.01)
  *H01L 33/64* (2010.01)
  *H05K 1/02* (2006.01)
  *H05K 1/03* (2006.01)
  *H05K 1/18* (2006.01)
  *H01L 23/15* (2006.01)
  *H01L 23/498* (2006.01)

(52) U.S. Cl.
  CPC .... *H01L 23/3735* (2013.01); *H01L 23/49822* (2013.01); *H01L 23/49827* (2013.01); *H01L 23/60* (2013.01); *H01L 25/075* (2013.01); *H01L 25/167* (2013.01); *H01L 33/642* (2013.01); *H05K 1/0206* (2013.01); *H05K 1/0207* (2013.01); *H05K 1/0306* (2013.01); *H05K 1/189* (2013.01); *H05K 2201/10106* (2013.01); *H05K 2201/10151* (2013.01)

(56) References Cited

U.S. PATENT DOCUMENTS

| | | |
|---|---|---|
| 10,014,459 B2 | 7/2018 | Feichtinger et al. |
| 10,626,054 B2 * | 4/2020 | Kato ..................... C04B 35/195 |
| 2002/0180027 A1 * | 12/2002 | Yamaguchi .......... H05K 1/0271 |
| | | 257/772 |
| 2005/0062582 A1 | 3/2005 | Feichtinger et al. |
| 2009/0091020 A1 * | 4/2009 | Wei ...................... H05K 1/0306 |
| | | 257/E23.113 |
| 2009/0315057 A1 * | 12/2009 | Konishi .................. H01L 33/56 |
| | | 257/E33.061 |
| 2011/0300355 A1 * | 12/2011 | Katsube ............ C04B 35/62685 |
| | | 428/210 |
| 2012/0056217 A1 * | 3/2012 | Jung ....................... H01L 33/48 |
| | | 257/89 |
| 2015/0144983 A1 | 5/2015 | Feichtinger et al. |
| 2015/0334877 A1 | 11/2015 | Kawagoe et al. |
| 2017/0229617 A1 | 8/2017 | Feichtinger |
| 2018/0070436 A1 | 3/2018 | Feichtinger et al. |

FOREIGN PATENT DOCUMENTS

| | | |
|---|---|---|
| DE | 102015104641 A1 | 9/2016 |
| EP | 2280428 A1 | 2/2011 |
| JP | 2005512317 A | 4/2005 |
| JP | 2006128512 A | 5/2006 |
| JP | 2015517740 A | 6/2015 |
| KR | 20160080089 A | 7/2016 |
| WO | 2008111408 A1 | 9/2008 |

* cited by examiner

LED MODULE

This patent application is a national phase filing under section 371 of PCT/EP20 18/071787, filed Aug. 10, 2018, which claims the priority of German patent application 102017118490.2, filed Aug. 14, 2017, each of which is incorporated herein by reference in its entirety.

TECHNICAL FIELD

The present invention relates to a multi-LED system designed in particular for generating a flashlight. Such multi-LED systems are particularly required for mobile applications such as smartphones or digital cameras.

BACKGROUND

Multi-LED systems having a hybrid construction composed of a substrate and an assembly with passive components as well as with two light-emitting diodes (LEDs) are known. The LEDs are covered with light conversion layers, so that a combination of warm white light and of cold white light is produced, for example. This is to ensure better illumination and more natural colors when using the flash. A known solution comprises an LED submodule which is mounted on a metal core board. This submodule is mounted on a main board together with individual passive components and the driver for the multi-LED system.

However, in particular mobile applications such as digital cameras, smartphones and the like increasingly require space-saving solutions, which cannot be realized using a hybrid configuration.

SUMMARY OF THE INVENTION

Embodiments provide a more highly integrated LED module which is particularly suitable for being used as an LED flash module.

An LED module is specified which is built on a thermally well conducting substrate made of a multilayer ceramic. All components of the module can be mounted and/or integrated on the substrate. At least one LED and passive SMD components, in particular for realizing a driver circuit for the LED, are arranged on the substrate. Also, at least one passive component is integrated in the substrate. Furthermore, the module comprises means for the dissipation of waste heat in horizontal and vertical directions.

Due to the thermally conductive substrate and the means for the dissipation of waste heat, the module is ideally suited for heat-producing semiconductors, like the LED and the associated drivers. A thermally well-conducting substrate is understood to mean a substrate which has a material with a thermal conductivity of more than 20 W/mK. More advantageous are existing ceramic materials having an even higher heat dissipation value of more than 100 W/mK, for example.

The multilayer ceramic used as a substrate comprises several ceramic layers, between which structured metallization layers are arranged. On the two surfaces, too, structured metallic layers can be provided. They are intended for rewiring and, for this purpose, are connected via through-contacts or so-called vias both to each other and to contacts on the top side of the substrate or to terminals on the bottom side of the substrate.

The substrate material is selected such that it constitutes a functional ceramic for the passive components integrated in the substrate. As an example, it is possible to integrate components that are selected from among varistors, capacitors, thermistors, resistors, NTC elements, PTC elements and coils.

The means for the dissipation of waste heat comprise thermal vias, which are routed through the substrate. A thermal via can have a larger cross-section than a via that is optimized solely for functioning as an electrical through-contact. Advantageously, the thermal vias are routed from a contact on the top side of the substrate in a straight line through the substrate as far as a terminal on the bottom side of the substrate. Such vias are also referred to as stacked vias as they are usually produced by arranging several vias of individual ceramic layers on top of each other. From the bottom side of the substrate, the heat can be dissipated further to a circuit environment which comprises a heat sink and into which the module can be incorporated. The improved waste heat dissipation definitely prevents excessive heating of the module or its components.

In order to achieve a quicker horizontal dissipation of waste heat off waste-heat-generating components, metallic layers can be formed in the substrate as horizontal thermal dissipation layers or heatspreaders. Here, again, these thermal dissipation layers are formed with a larger cross-section or a larger surface than those structured metal layers that solely provide for electrical contacting of parts or components. By speeding up horizontal and vertical heat dissipation, possible heating of the module is reduced further.

In one embodiment an ESD protection element is integrated in the ceramic of the substrate. The ESD protection element can be present in the form of a varistor. For this purpose at least some of the ceramic layers in the multilayer ceramic are formed from a varistor material. Suitable materials for this are various materials based on zinc oxide, for example ZnO—Bi, ZnO—BiSb, ZnO—Pr, SiC or $SrTiO_3$ and others.

An ESD protection element in the form of a varistor has two terminals, each of which is connected to a plurality of alternately overlapping electrode areas inside the multilayer ceramic. The varistor voltage can be adjusted via the distance of two adjacent different electrodes, for instance.

In one embodiment a semiconductor component is mounted on the surface of the substrate. Besides the LED, the semiconductor component can have an integrated circuit for a driver circuit for the LED and/or a microcontroller.

The semiconductor component can be designed as an SMD component. It is also possible to fix the semiconductor component by means of a flip-chip arrangement, or to glue it and connect it to a contact on the top side of the substrate via a bonding wire. These mounting options can also be used optionally and possibly in different forms for the remaining components to be applied on the surface of the substrate.

It is also possible, however, to use the bottom side of the substrate for mounting parts and components on the module. In this way, the available surface for mounting components is larger so that a more highly integrated module can be obtained.

The bottom side of the LED module exhibits external contacts, by means of which the module can be connected to a circuit board. Such circuit board can be selected from among metal core boards, rigid-flex boards or flex boards. A flex board or a rigid-flex board has the advantage that it can establish a flexible connection to a further circuit board or a PCB.

In one embodiment the substrate has several layers made of different functional ceramics. Into these different materials different passive components are integrated, wherein the integrated components then use the functional ceramic as a function-defining layer. Such passive components can be selected from among capacitor, coil, resistor, ESD protection element or NTC element. One or several components can be integrated within the module.

If the passive elements must fulfil high quality requirements or high performance requirements, preference is given to mountable discrete components. However, varistors can be integrated in the substrate without reducing quality or performance.

The substrate of the module can comprise a ceramic selected from among aluminum oxide, zinc oxide or aluminum nitride. While the first two of these materials have thermal conductivities of more than 20 W/mK, aluminum nitride can be considered as a particularly good heat conductor, having a heat conductivity of more than 100 W/mK.

In a further embodiment the module comprises a ceramic based on manganese and Ni which has an NTC functionality. In this type of ceramic an NTC component can then be integrated as a protection element.

In one embodiment the module comprises a sensor, which is mounted on the substrate as a component. Such sensors serve to optimize the components, or optimize their operational capability, if the capability is dependent on external parameters, like temperature or brightness, for example. A sensor can accordingly be present in the form of a temperature sensor or a light sensor.

A simple type of temperature sensor comprises an NTC element. The light sensor can be a photoelectric element, a photodiode or a solar cell.

If the LED module is used as an LED flash module, it additionally comprises discharge capacitors, microcontrollers, inductances and resistors, which are necessary when the module is to be operated as a flash module. All these components can as well be mounted as discrete elements on or under the substrate.

The proposed ceramic module makes it possible to realize an LED module with improved (reduced) response time, as the ceramic of the module exhibits a very low heat capacity and good thermal coupling of the individual components of the module. This is particularly advantageous for flash light applications, especially those with multiple and/or ultra-short pulses.

The present module has an extremely compact design and is practically a one-piece device in contrast to known hybrid modules. Hence the module constitutes a so-called SIP (System In Package) module. The amount of heat, which is generally higher due to the high density of integration and which must be dissipated during operation of the module, is at least compensated by the provided measures for heat dissipation. In some embodiments of the module the higher amount of waste heat is even overcompensated, so that modules of that type exhibit a lower temperature increase during operation than do known LED modules.

Due to the compact design of the LED module as a ceramic multilayer structure it is also possible to implement an LED matrix used as a flashlight for a camera with very small distances between the individual LEDs. In this way it is possible to also make the optical system at or above the LED matrix very small, so that better optical properties can be obtained at lower manufacturing costs.

Especially for designing the LED module as a flashlight module for a camera, measures for suppressing optical crosstalk between the LED and the camera can be taken. For example, cavities can be formed in the module, the cavities reducing or interrupting the conduction of light within the substrate. These cavities can advantageously be provided all around the LED matrix, preferably in one or more near-surface layers.

Furthermore, electrical or optical components of the camera can be provided in or on the module, for example a CMOS chip, in particular one that can function as an image sensor.

The module is smaller in volume than known modules and can thus be easily incorporated into miniaturized or mobile devices such as smartphones or digital cameras. Apart from being used as a flash module it can also be designed as a lighting module, as required in particular for a torch function or as backlighting for video recordings.

BRIEF DESCRIPTION OF THE DRAWINGS

In the following the invention is explained in more detail with the aid of exemplary embodiments and corresponding Figures. The Figures are schematic representations only and are not drawn to scale, so that the Figures feature neither absolute nor relative dimensions. Individual parts may be magnified or minimized for illustration purposes. Identical or identically acting parts are indicated with the same reference signs.

DETAILED DESCRIPTION OF ILLUSTRATIVE EMBODIMENTS

Figure 1:
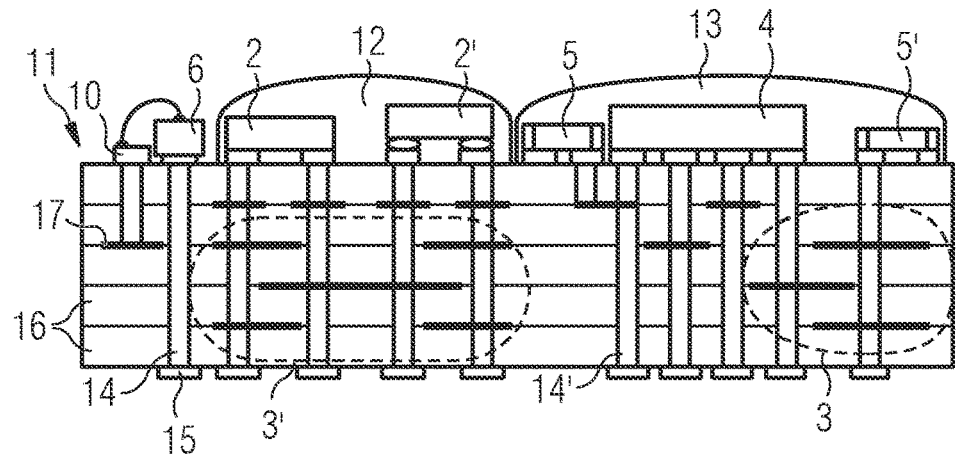
FIG. 1 shows a schematic cross-section of an LED module.

FIG. 1 shows a schematic cross-section of an LED module which is designed, for example, as an LED flash module with an integrated driver, temperature sensor, light sensor, discharge capacitors, inductance and resistors. The LED module comprises a substrate 11 made of a multilayer ceramic. In the substrate several ceramic layers 16 are arranged, each between structured metallization layers 17.

On the top side of the substrate contacts 10 are provided, by means of which the components to be mounted can be connected electrically. On the bottom side of the substrate terminals 15 are provided, which are for connecting the module to an external circuit environment.

The structured metallization layers, or rather the conductor paths and electrode areas produced therefrom, are connected via through-contacts or vias 14 among each other, to the contacts 10 and/or to the terminals 15. Individual, preferably several or even all vias 14 can be present in the form of thermal vias.

Inside the substrate 11 a passive component is integrated, the passive component being depicted and designed as a varistor 3 in the Figure. The varistor has several overlapping electrode layers 17, which are alternately connected to different vias. Such a varistor is a non-linear element, whose resistance is dependent on the voltage applied at the two electrodes. If an overvoltage occurs, the varistor harmlessly dissipates the overvoltage in the form of a short-circuit to the other electrode. Here it is possible to connect both electrodes of the varistor to two terminals of the part or component to be protected, in particular the LED. However, it is also possible to connect only one electrode of the varistor to the component and to connect the other electrode of the varistor to a ground connection on the bottom side of the substrate.

On the top side of the substrate various components are mounted, wherein different mounting options can be provided for. For example, the Figure illustrates a light sensor 6, which can be designed as an NTC resistor. One of the electrodes of the resistor can be directly connected to a through-contact 14, while the other one is connected to a neighbouring contact 10 via a bonding wire. Reference numerals 2 and 2' designate two LEDs on the top side of the substrate which can have the same design and/or the same mounting type. It is expedient for an LED module, though, to use different LEDs with different light colors or light intensities. Above the LEDs 2, 2' emitting to the top here, a light conversion layer 12 can be applied, for example a lacquer filled with corresponding conversion material. Furthermore, ceramic multilayer capacitors applied in an SMD technique (SMD MLCC) 5 can be arranged or mounted on the surface. FIG. 1 shows an SMD-mounted NTC sensor 4 as well as a further capacitor 5'.

Each of the contacts 10 on the top side can be assigned to one terminal 15 on the bottom side of the substrate 11. Usually, due to the multilayer wiring inside the substrate 11, the number of terminals 15 is reduced compared to the number of contacts 10. If, besides the vias functioning as an electrical connection, also thermally acting vias which are used solely for heat dissipation are provided in the substrate 11, each of the vias can be guided to a terminal 15 on the bottom side that is to be connected to ground. However, it is also possible to provide one or more terminals having a larger area than other terminals for ground and to connect each of them to several thermal vias.

Figure 2:
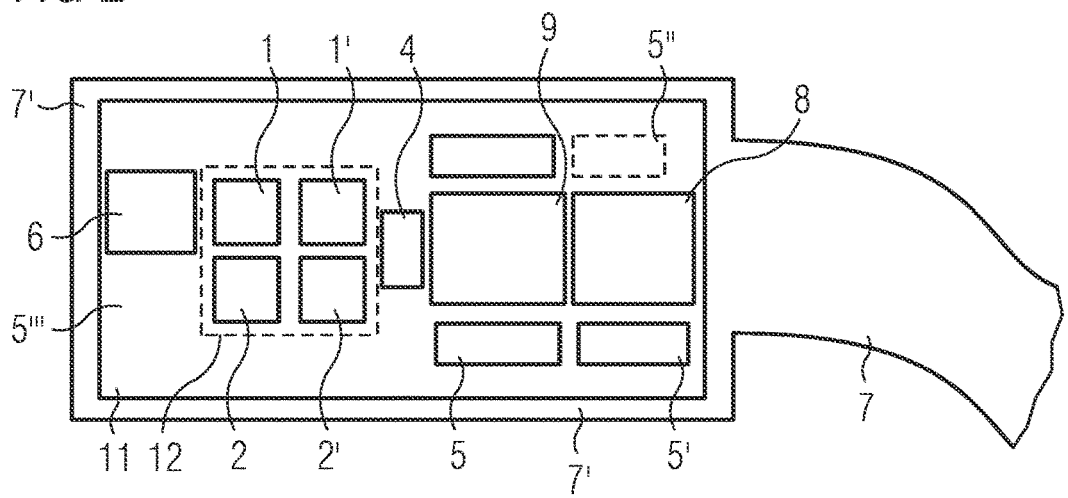
FIG. 2 shows a schematic top view of an embodiment of an LED module on a flexible carrier.

FIG. 2 shows a top view of an embodiment for the LED module that is illustrated only schematically in FIG. 1. Here, on the substrate 11 of the module four LEDs 1, 1', 2, 2' are mounted, which are of two different designs. The temperature sensor can be designed as an NTC component 4. Capacitors 5, 5' and 5" can represent discharge capacitors or matching capacitors which are mounted on the surface of the substrate 11. Furthermore, a coil 8 and a driver for the LED 9 are depicted here, each of which is mounted on the top side as a discrete component. A further capacitor is designated with 5'''. A light-sensitive element is present in the form of a light sensor 6.

In the exemplary embodiment the substrate 11 is mounted on a carrier board 7, 7'. The carrier board can comprise a mechanically more stable central part 7' and a more flexible terminal part 7. Like a circuit board, the carrier board 7, 7' has contact areas, which can be connected to the terminals 15 of the substrate. Soldering is the preferred method of connection.

Figure 3:
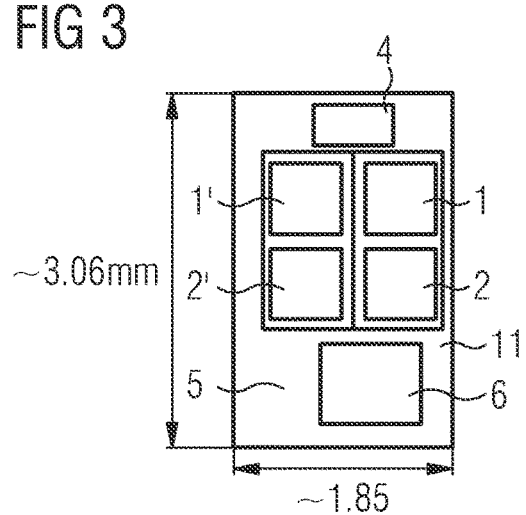
FIG. 3 shows a top view of a further embodiment of an LED module.

FIG. 3 shows a further embodiment of an LED module in a schematic top view. Four LEDs 1, 1', 2, 2' are mounted on the substrate 11. At least one capacitor 5, one temperature sensor 4 and one light sensor 6 are mounted as further discrete components. Such a module can be designed with minimum dimensions, which can be 1.85×3.06 mm, for example, in the illustrated embodiment.

What is not depicted in FIGS. 2 and 3 are varistors 3, which are integrated in the module substrate 11 and are thus not visible in the top view.

Figure 4:
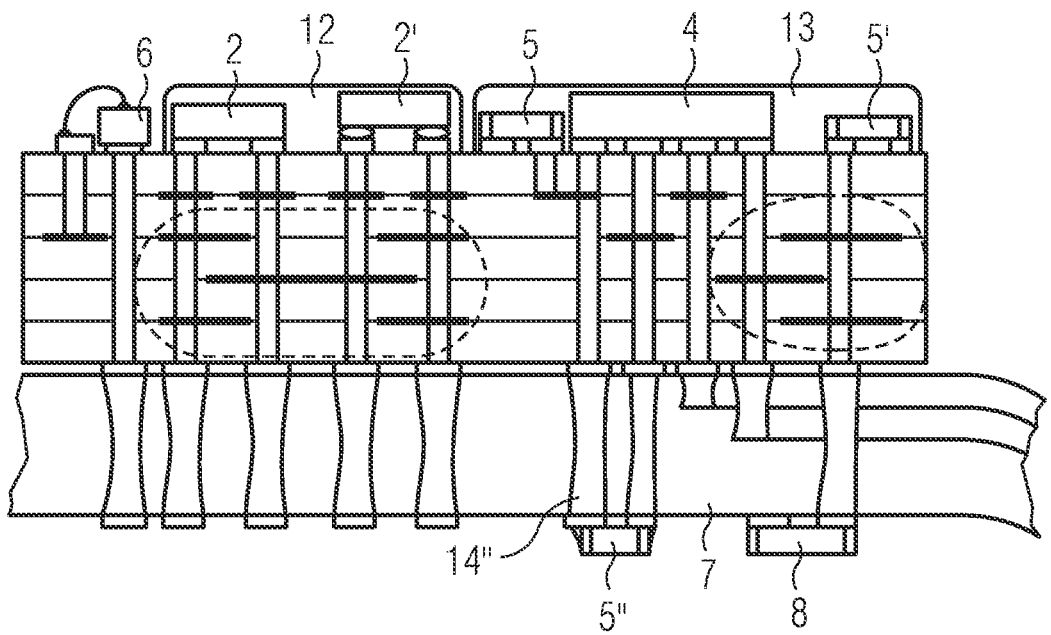
FIG. 4 shows a schematic cross-section of an LED module on a flexible carrier.

FIG. 4 shows a schematic cross-section of an LED module 11 like the one depicted in FIG. 1, which is mounted on a flexible carrier 7. In the illustrated embodiment the flexible carrier comprises thermal vias 14", which are routed vertically through the flexible carrier. On the bottom side of the carrier 7, the vias are connected to further terminal areas. These terminal areas can serve for further contacting with the circuit environment or for mounting further components, such as MLCC capacitors 5" or an inductance 8. Such mounting on the bottom side of a carrier, depicted as flexible here, is particularly suitable for large-area components, as well as for components whose heat production is especially high and which should therefore be arranged at a distance from other components.

The flexible carrier 7 can comprise integrated metallic layers, which can be led out of the carrier laterally and can be fixed to a desired spot on a main board by means of the flexible part of the carrier. Furthermore, FIG. 6 illustrates a reflecting layer 13, which can be applied in the form of a lacquer over part of the components. The reflecting lacquer 13 serves to improve the emission of the LEDs, or rather increase the light output of the LED module.

Figure 5:
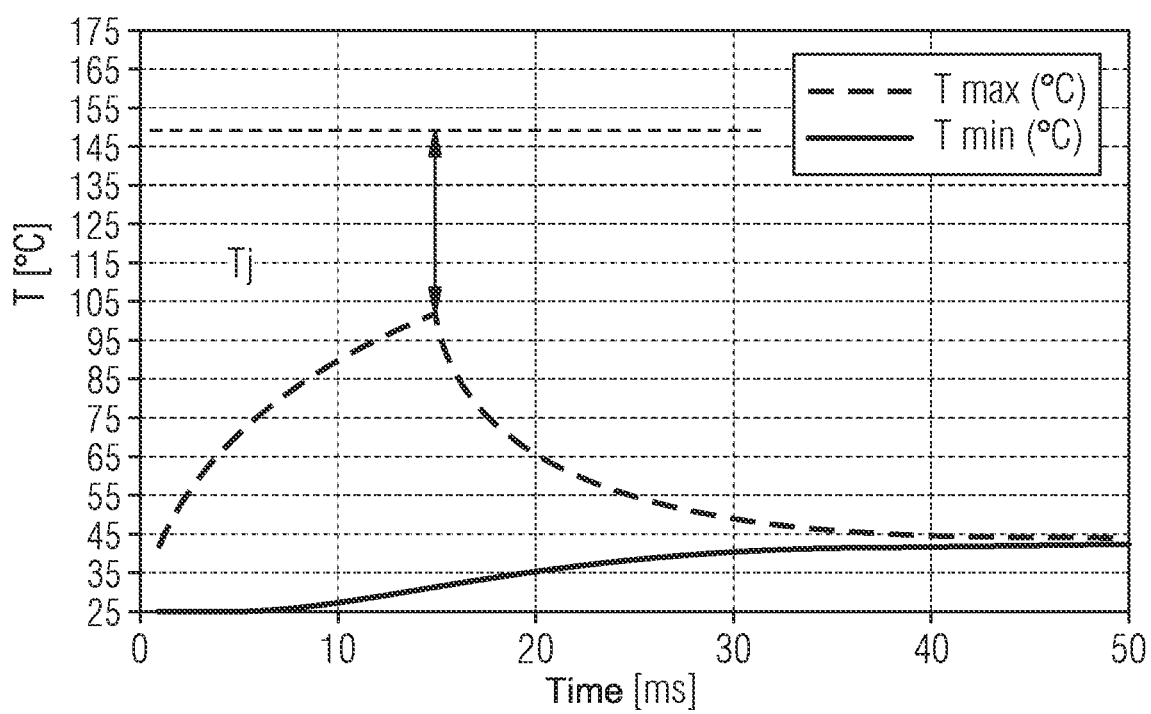
FIG. 5 shows the improved temperature behavior of a module by means of a temperature curve as a function of time.

FIG. 5 shows the temperature behavior of an exemplary LED module during operation. It is shown that the waste heat generated during operation of the module initially leads to an increase in temperature, which is dissipated again rapidly, however, as can be seen from the upper curve. After the flash event with the related temperature increase the temperature drops again rapidly.

The lower curve represents the temperature behavior without the use of the LED, wherein in the standy operation inherently only a smaller temperature increase occurs at the module. Owing to the good or improved heat dissipation it is achieved that the maximum temperature reached during operation remains far below the allowed temperature limit of in this case 150° C., for example, which is a critical temperature for the LED's functionality.

The LED module can be designed as a so-called CeraPad module. For connecting the components on the substrate 11 and for connecting the module to a circuit environment a solder comprising tin, silver and copper can be used. In a carrier board a heat sink based on copper can be provided, the heat sink exhibiting both a high conductivity and a sufficient specific heat.

In the following table the thermal conductivities, the density and the specific heat are indicated for the materials of the module used in the exemplary embodiments. The table shows that the metallizations and the vias as well as the inner metallization layers and the heat sink exhibit the maximum relative thermal conductivity. The thermal conductivity of the ceramic material, in contrast, is low, which is compensated, though, by the high thermal conductivity of the heat-dissipating means.

| | Ceramic | Top side and bottom side metallizations | Via and metalliza-tion layers | LED | Copper heat sink | Solder |
|---|---|---|---|---|---|---|
| Thermal conductivity (W/Km) | | 22 | 90 | 180 | 35 | 400 | 67 |

-continued

| Ceramic | Top side and bottom side metallizations | Via and metalliza-tion layers | LED | Copper heat sink | Solder |
|---|---|---|---|---|---|
| Density (kg/m$^3$) | 6640 | 8900 | 9500 | 3960 | 8933 | 7000 |
| Specific heat (JKgK) | 470 | 444 | 235 | 850 | 385 | 230 |

The invention was illustrated by means of just a few exemplary embodiments and is therefore not limited to the latter. The scope of the invention is regarded as covering all LED modules that comprise the features mentioned in claim 1. Features and components may be combined and/or integrated on the module in any given number and composition. Moreover, the module can comprise further components not mentioned here without deviating from the invention.

The invention claimed is:

1. An LED module comprising:
a substrate made of a thermally conductive multilayer ceramic;
at least one LED arranged on the substrate;
passive SMD components arranged on the substrate;
a passive component integrated in the substrate; and
a heat spreader configured to dissipate waste heat in horizontal and vertical directions.

2. The LED module according to claim 1, wherein thermal vias are routed through the substrate as the heat spreader.

3. The LED module according to claim 1, further comprising structured metallic layers in and/or on the thermally conductive multilayer ceramic, wherein at least one of the metallic layers is a horizontal, thermal dissipation layer as the heat spreader.

4. The LED module according to claim 1, further comprising an ESD protection element integrated in the thermally conductive multilayer ceramic, wherein the ESD protection element is a varistor.

5. The LED module according to claim 1, further comprising an active semiconductor component mounted on a surface of the substrate.

6. The LED module according to claim 5, wherein a driver, a microcontroller or discharge capacitors is/are mounted on the substrate.

7. The LED module according to claim 1, wherein the passive SMD components are selected from the group consisting of a capacitor, a coil, a resistor, a PTC element and an NTC element, and wherein the passive SMD components are mounted on a top side or a bottom side of the substrate.

8. The LED module according to claim 1, further comprising wiring layers provided in the substrate for wiring all components integrated on and in the thermally conductive multilayer ceramic.

9. The LED module according to claim 1, further comprising terminals arranged on a bottom side, wherein the terminals are configured to establish a connection with a metal core board, a rigid-flex board or a flex board.

10. The LED module according to claim 1, wherein the substrate comprises several layers of different functional thermally conductive ceramics, and wherein different passive components selected from the group consisting of a capacitor, a coil, a resistor, an ESD protection element and an NTC element are implemented in different layers of the layers of different functional thermally conductive ceramics.

11. The LED module according to claim 1, wherein the thermally conductive multilayer ceramic comprises AlOx, ZnO, AlN, an MnNi-ceramic or a varistor ceramic.

12. The LED module according to claim 1, wherein the substrate comprises a thermally conductive MnNi-ceramic, wherein the thermally conductive MnNi-ceramic has an NTC functionality, and wherein an NTC element is formed in the thermally conductive MnNi-ceramic.

13. The LED module according to claim 1, further comprising cavities formed in the substrate, wherein the cavities are configured to reduce disturbing optical interactions of light from the LED with any other component inside or outside the LED module.

14. The LED module according to claim 1, further comprising a sensor mounted on the substrate, wherein the sensor is a temperature sensor or a light sensor.

15. The LED module according to claim 1, wherein the LED module is a flashlight module of a camera, and wherein optical components of the camera are integrated in or on the flashlight module.

16. An LED module comprising:
a substrate made of a thermally conductive multilayer ceramic;
at least one LED arranged on the substrate;
passive SMD components arranged on the substrate;
a passive component integrated in the substrate;
a heat spreader configured to dissipate waste heat in horizontal and vertical directions;
terminals arranged on a bottom side of the LED module;
a flex board connected to the terminals; and
a LED mounted to the flex board.

17. An LED module comprising:
a thermally conductive substrate;
at least one LED arranged on the thermally conductive substrate;
passive SMD components arranged on the thermally conductive substrate;
a passive component integrated in the thermally conductive substrate; and
a heat spreader configured to dissipate waste heat in horizontal and vertical directions,
wherein the thermally conductive substrate comprises a MnNi-ceramic,
wherein the MnNi-ceramic has an NTC functionality, and wherein an NTC element is formed in the MnNi-ceramic.

\* \* \* \* \*

UNITED STATES PATENT AND TRADEMARK OFFICE
CERTIFICATE OF CORRECTION

PATENT NO. : 11,417,583 B2
APPLICATION NO. : 16/636881
DATED : August 16, 2022
INVENTOR(S) : Thomas Feichtinger It is certified that error appears in the above-identified patent and that said Letters Patent is hereby corrected as shown below:

In the Claims

Claim 11, Column 8, Line 18; delete "AIN" and insert --AlN--.

Signed and Sealed this
Eighteenth Day of October, 2022

Katherine Kelly Vidal
*Director of the United States Patent and Trademark Office*